(12) United States Patent
Kishi et al.

(10) Patent No.: US 7,780,057 B2
(45) Date of Patent: Aug. 24, 2010

(54) SOLDERING APPARATUS AND SOLDERING METHOD

(75) Inventors: Arata Kishi, Osaka (JP); Kimiaki Nakaya, Osaka (JP); Kenichiro Suetsugu, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/337,826

(22) Filed: Dec. 18, 2008

(65) Prior Publication Data

US 2009/0166398 A1 Jul. 2, 2009

(30) Foreign Application Priority Data

Dec. 28, 2007 (JP) ............................. 2007-338680
Nov. 21, 2008 (JP) ............................. 2008-298779

(51) Int. Cl.
*B23K 1/08* (2006.01)
(52) U.S. Cl. ....................................................... 228/37
(58) Field of Classification Search ................. 228/178, 228/179.1, 180.1, 36, 37
See application file for complete search history.

(56) References Cited

U.S. PATENT DOCUMENTS 3,497,945 A * 3/1970 Green ......................... 228/196

FOREIGN PATENT DOCUMENTS

| JP | 07-212020 A | 8/1995 |
| JP | 2001-239359 A | 9/2001 |
| JP | 2002-335074 A | 11/2002 |
| JP | 2005-203582 A | 7/2005 |

* cited by examiner

*Primary Examiner*—Jessica L Ward
*Assistant Examiner*—Megha Mehta
(74) *Attorney, Agent, or Firm*—RatnerPrestia

(57) ABSTRACT

A soldering apparatus has a conveyor which conveys an electronic circuit board, a fluxer which applies a flux having water as a solvent to a surface of the electronic circuit board to be soldered, a first heating device which heats the electronic circuit board, a water removal device which removes water attached to the electronic circuit board, a second heating device which heats the electronic circuit board to maintain the electronic circuit board at a temperature at which the flux exerts its activating action, a flow soldering bath in which molten solder is attached to the electronic circuit board, and a cooler. The water removal device includes a gas blowing portion having a first jig which blows a gas to an electronic component disposition surface, and a drawing portion having a second jig which draws water from the surface to be soldered.

10 Claims, 13 Drawing Sheets

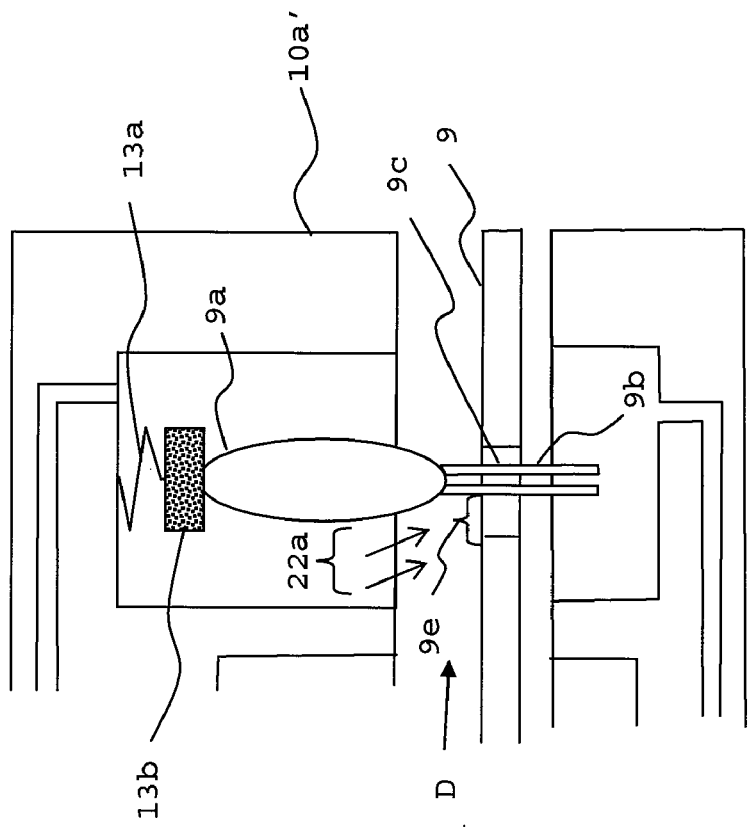
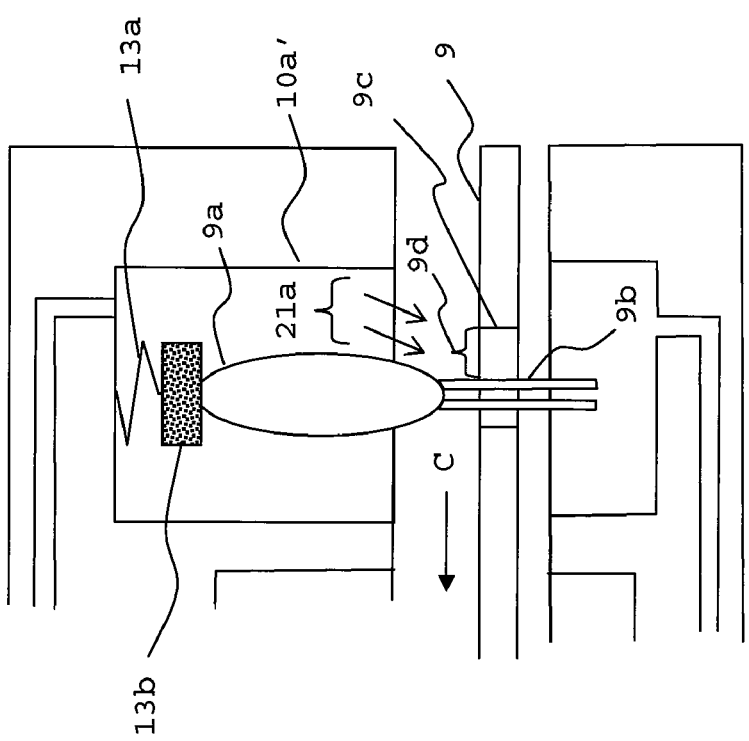

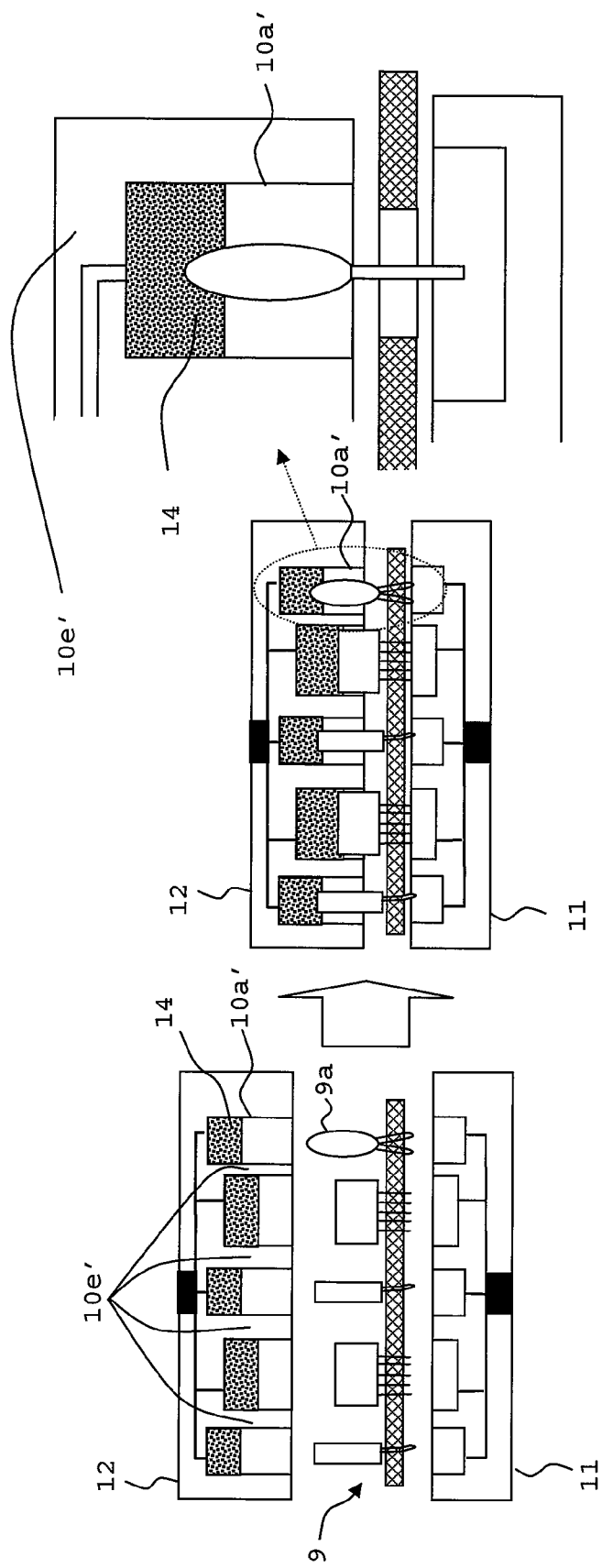

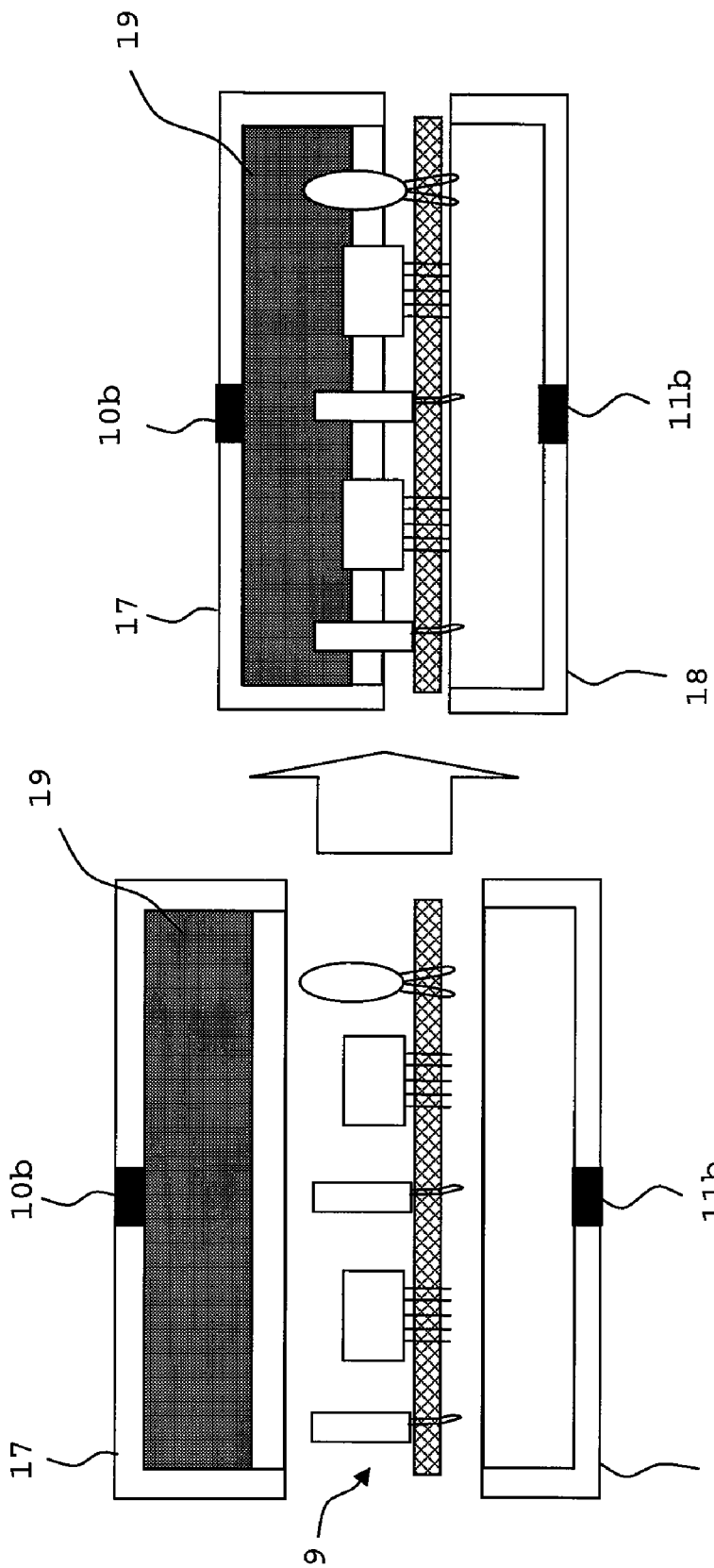

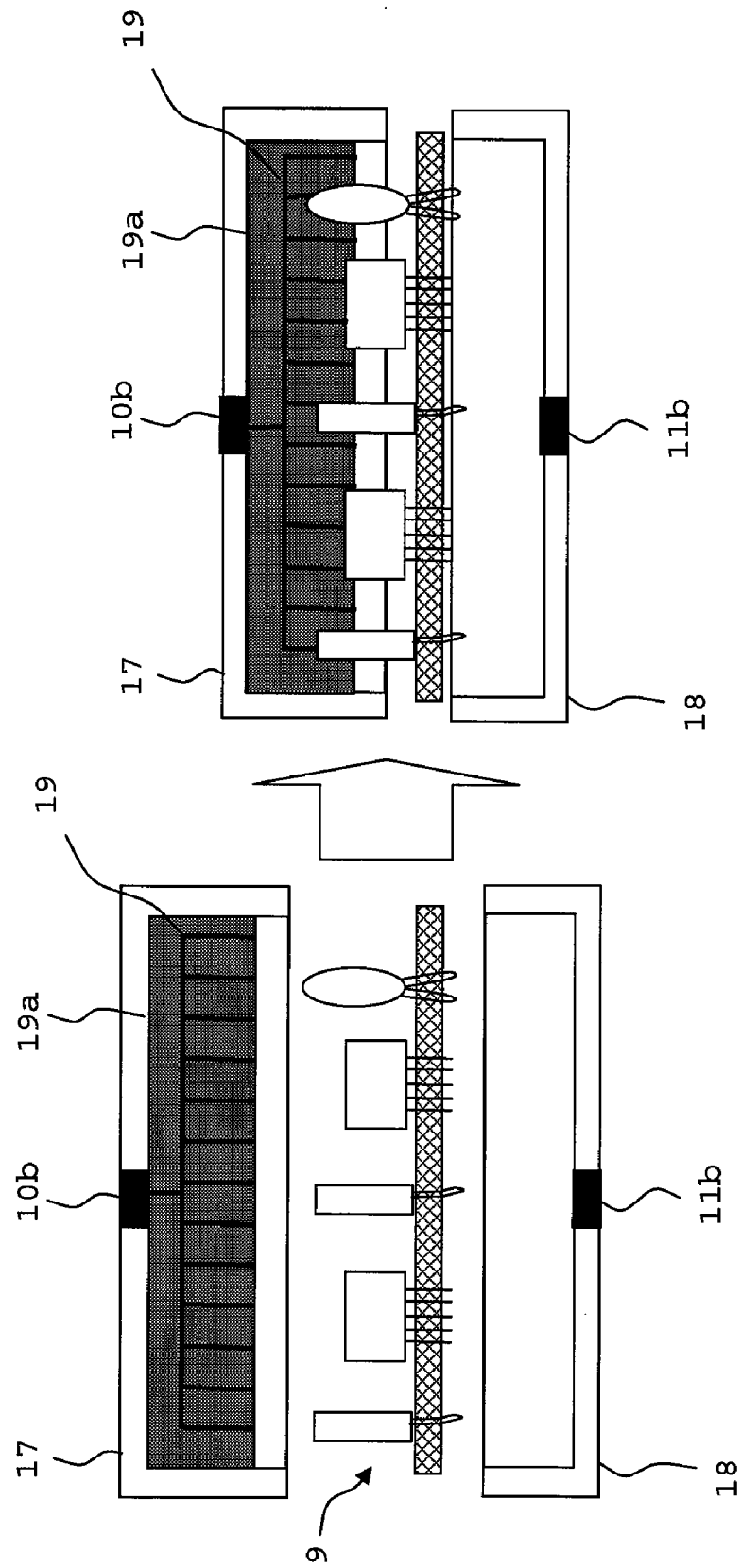

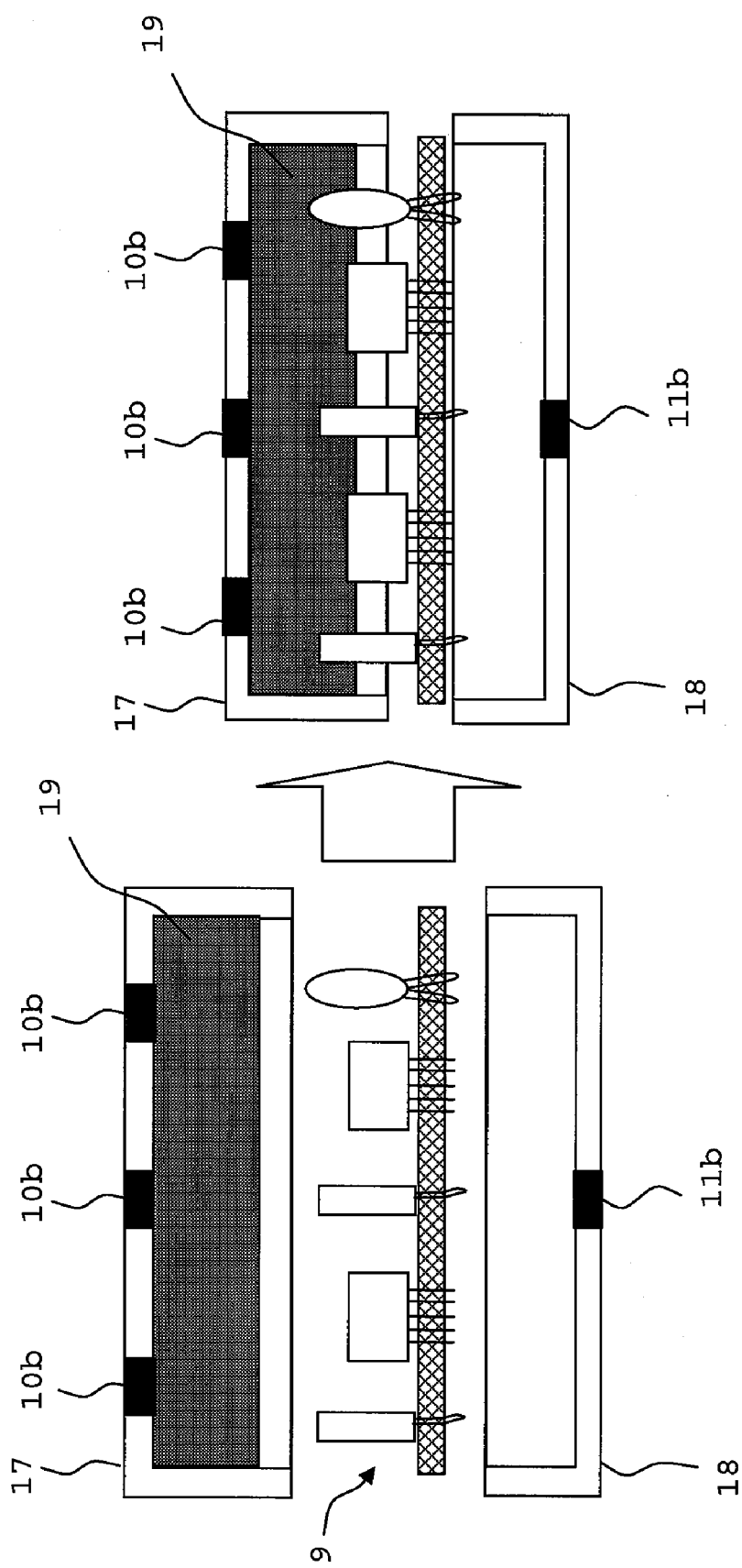

SOLDERING APPARATUS AND SOLDERING METHOD

BACKGROUND OF THE INVENTION

1. Field of the Invention

The present invention relates to a soldering apparatus and a soldering method, e.g., a soldering apparatus and a soldering method with which flow soldering on an electronic circuit board on which a flux having water as a solvent is applied is performed while removing water from the electronic circuit board.

2. Related art of the Invention

A conventional apparatus for soldering on an electronic circuit board is constituted by a fluxer which applies a flux, a heating device for causing the applied flux to exert activating action, a flow solder bath for attaching molten solder to a surface to be soldered, and a cooler for cooling the soldered circuit board. Flow soldering has been performed by using this apparatus.

The flux used in this soldering is obtained by dissolving solid components such as rosin and an activator in a solvent and is applied to a surface of an electronic circuit board to be soldered by a foaming fluxer or a spray fluxer. The applied flux is heated so as to be maintained at a state of a temperature of 100 to 150° C. to evaporate the solvent. By exerting the action of the activator in this state, the surface of the electronic circuit board to be soldered can be cleaned. Unless this heating is performed, the surface to be soldered is not cleaned and a good soldered surface cannot be obtained by bringing the surface to be soldered into contact with the molten solder in the flow solder bath.

In the solvent of the above-described flux, alcohol such as isopropyl alcohol is used. Solvents such as alcohol (volatile organic compounds: VOC), however, are decomposed by ultraviolet rays or the like when released into the atmosphere. Radicals are thereby formed to act as a cause of photochemical smog. Therefore, the development of fluxes having reduced amounts of VOCs or using no VOCs is being pursued.

FIG. 12 is a diagram showing an arrangement for a soldering apparatus described in Japanese Patent Laid-Open No. 2005-203582. As shown in FIG. 12, a soldering apparatus 200 has an arrangement in which a fluxer 1, a first heating device 2, a second heating device 3, a flow solder bath 4 and a cooler 5 are successively disposed along a direction A of movement of a conveyor 8 which conveys electronic circuit boards (not shown). The second heating device 3, the flow solder bath 4 and the cooler 5 are integrally housed in one unit.

In Japanese Patent Laid-Open No. 2005-203582, a flow soldering method using the soldering apparatus 200 shown in FIG. 12 and applicable with a flux having water as a solvent is described. The soldering apparatus 200 uses, as a method of removing the water content of a flux having water as a solvent and applied to an electronic circuit board by the fluxer 1, the first heating device 2 using far infrared rays and hot air in combination. That is, the first heating device 2 has the function of efficiently removing water applied to an electronic circuit board by the fluxer 1.

On the electronic circuit board passed through the first heating device 2, the activating action of the flux is exerted by the second heating device 3. In the flow solder bath 4, soldering is performed on the electronic circuit board passed through the second heating device 3 by bringing molten solder into contact with a surface of the electronic circuit board to be soldered. After soldering, the electronic circuit board is cooled by the cooler 5. By these steps, soldering is completed.

FIG. 13 is a diagram showing another arrangement for a soldering apparatus described in Japanese Patent Laid-Open No. 2005-203582. As shown in FIG. 13, a soldering apparatus 300 has an arrangement in which a vacuum drying device 6 is provided between a fluxer 1 and a second heating device 3.

A flow soldering method using the soldering apparatus 300 and applicable with a flux having water as a solvent is described. The soldering apparatus 300 uses the vacuum drying device 6 as a method of removing the water content of a flux having water as a solvent and applied to an electronic circuit board by the fluxer 1. The vacuum drying device 6 uses the effect of removing water as described below. The vacuum drying device 6 puts in a chamber 6a an electronic circuit board (not shown) to which a flux having water as a solvent has been applied, and subjects the electronic circuit board to a reduced pressure to reduce the boiling point of water, thereby removing the water content. On the electronic circuit board after processing with the vacuum drying device 6, the activating action of the applied flux is exerted by the second heating device 3. In the flow solder bath 4, soldering is performed on the electronic circuit board passed through the second heating device 3 by bringing molten solder into contact with a surface of the electronic circuit board to be soldered. After soldering, the electronic circuit board is cooled by the cooler 5. By these steps, soldering is completed.

The above-described conventional soldering apparatuses and methods, however, have problems described below.

In the above-described arrangement shown in FIG. 12, a heating device using far infrared rays and hot air in combination is used as the first heating device 2. It is necessary to heat in the first heating device 2 an electronic circuit board to which a flux having water as a solvent has been applied by the fluxer 1 until the water content in the flux is completely removed by drying with hot air effective in drying up water.

In this case, however, a time of about 120 seconds is required to increase the temperature of the electronic circuit board to the desired temperature in order to completely evaporate water attached to the electronic circuit board.

On the other hand, if the electronic circuit board is left in the first heating device 2 for an excessively long time in an attempt to completely evaporate attached water, there is a risk of the temperatures of low-heat-resistant components on the electronic circuit board being increased above the heat resistance temperatures to damage the components.

In actuality, therefore, it is difficult to continue putting an electronic circuit board in the first heating device 2 until the water content of a flux having water as a solvent is completely removed from the electronic circuit board. After all, actual use of the conventional soldering apparatus 200 and soldering method shown in FIG. 12 entails a problem that part of the water content of a flux remains on an electronic circuit board before soldering.

If water on the electronic circuit board cannot be completely removed by the first heating device 2, a good soldered surface cannot be obtained by performing heating with the second heating device 3 and bringing the electronic circuit board into contact with molten solder in the high-temperature flow solder bath 4. If water cannot be sufficiently removed, the activation by the flux component cannot be sufficiently exerted in the second heating device 3 and oxides on the substrate surface cannot be removed. That is, failure to sufficiently wet the electronic circuit board with solder occurs.

Further, if the water content of the flux having water as a solvent cannot be completely removed in the second heating device 3, water not removed is evaporated by an abrupt increase in temperature in the flow solder bath 4 to scatter solder, thereby causing a solder ball defect.

The above-described problem that part of the water content of a flux remains on an electronic circuit board has been observed, for example, particularly as a phenomenon in which film of water is formed so as to cover vent holes in an electronic circuit board and gaps between leads of electronic component parts and peripheral portions of holes in which the electronic component parts are inserted.

In the arrangement for the soldering apparatus 300 shown in FIG. 13, the vacuum drying device 6 is used for drying. The vacuum drying device 6 utilizes the phenomenon in which the boiling point of water is reduced under a reduced pressure. With this arrangement, each of electronic circuit boards is subjected to a reduced pressure in the chamber of the vacuum drying device 6 after a flux having water as a solvent has been applied by the fluxer 1.

In this case, however, it is difficult to perform the preceding step using the fluxer 1 and the subsequent step using the second heating device 3 in an in-line manner, i.e., as operations on the conveyor 8.

This is because there is a need for operations including an operation to remove the electronic circuit board once from the line after the completion of the step using the fluxer 1, an operation to reduce the pressure, an operation to maintain the reduced pressure, and an operation to return the pressure to ordinary pressure after putting an electronic circuit board in the vacuum drying device 6, and because a time of at least about 600 seconds is taken before the completion of removal of water from the electronic circuit board. In actuality, therefore, it is difficult to continue putting an electronic circuit board in the vacuum drying device 6 until the water content of a flux having water as a solvent is completely removed from the electronic circuit board, as in the case of the arrangement shown in FIG. 12. Therefore, actual use of the conventional soldering apparatus and soldering method shown in FIG. 13 entails a problem that part of the water content of a flux remains on an electronic circuit board before soldering, as in the case of the arrangement shown in FIG. 12.

In view of the above-described problem of the conventional art, an object of the present invention is to provide a soldering apparatus and method which can be used so that no part of the water content of a flux remains on an electronic circuit board before soldering.

SUMMARY OF THE INVENTION

The $1^{st}$ aspect of the present invention is a soldering apparatus comprising:

a conveyance path through which an electronic circuit board is conveyed;

a fluxer which applies a flux having water as a solvent to a surface of the electronic circuit board to be soldered;

a first heating device which heats the electronic circuit board;

a water removal device which removes water attached to the electronic circuit board after processing in the first heating device;

a second heating device which heats the electronic circuit board to maintain the electronic circuit board at a temperature at which the flux exerts its activating action;

a flow solder bath which attaches molten solder to the electronic circuit board; and a cooler which cools the electronic circuit board, wherein the fluxer, the first heating device, the water removal device, the second heating device, the flow solder bath and the cooler are successively disposed along the conveyance path, and wherein the water removal device has a gas blowing portion from which a gas is blown to an electronic component disposition surface of the electronic circuit board on which electronic component parts are disposed, and a drawing portion through which water is drawn from the surface to be soldered.

The $2^{nd}$ aspect of the present invention is the soldering apparatus according to the $1^{st}$ aspect of the present invention, wherein the gas blowing portion changes at least one of the direction, intensity and position of blowing of the gas.

The $3^{rd}$ aspect of the present invention is the soldering apparatus according to the $1^{st}$ aspect of the present invention, wherein the water removal device further has a relative position changing portion which changes the relative positional relationship between the electronic circuit board and the gas blowing portion.

The $4^{th}$ aspect of the present invention is the soldering apparatus according to the $1^{st}$ aspect of the present invention, wherein the gas blowing portion has a first jig in the form of a lid including a first frame formed so as to surround at least an edge portion of the electronic circuit board;

the drawing portion has a second jig in the form of a tray including a second frame formed so as to surround at least an edge portion of the electronic circuit board; and the water removal device operates the gas blowing portion and the drawing portion while inserting the electronic circuit board between the first jig and the second jig.

The $5^{th}$ aspect of the present invention is the soldering apparatus according to the $4^{th}$ aspect of the present invention, wherein the first jig has an elastic member provided on a surface facing the electronic component disposition surface, and the elastic member contacts upper ends of the electronic component parts while the water removal device inserts the electronic circuit board between the first jig and the second jig.

The $6^{th}$ aspect of the present invention is the soldering apparatus according to the $4^{th}$ aspect of the present invention, wherein the first jig has first partition walls provided on the surface facing the electronic component disposition surface, and the gas introduced from the gas blowing portion passes through portions sectioned by the first partition walls.

The $7^{th}$ aspect of the present invention is the soldering apparatus according to the $5^{th}$ aspect of the present invention, wherein the first partition walls have shapes corresponding to the positions, shapes and sizes of the electronic components disposed on the electronic circuit board or holes provided in the electronic circuit board.

The $8^{th}$ aspect of the present invention is the soldering apparatus according to the $7^{th}$ aspect of the present invention, wherein the first jig has an elastic member provided on each of surfaces of the portions sectioned by the first partition walls, the surface of the sectioned portions facing the electronic component disposition surface, and the elastic member contacts upper ends of the electronic component parts while the water removal device inserts the electronic circuit board between the first jig and the second jig.

The $9^{th}$ aspect of the present invention is the soldering apparatus according to the $4^{th}$ aspect of the present invention, wherein the second jig has second partition walls provided on a surface facing the surface to be soldered, and water introduced from the drawing portion passes through portions sectioned by the second partition walls.

The $10^{th}$ aspect of the present invention is the soldering apparatus according to the $9^{th}$ aspect of the present invention, wherein the second partition walls have shapes corresponding to the positions, shapes and sizes of leads of the electronic components disposed on the electronic circuit board or the holes provided in the electronic circuit board.

The 11$^{th}$ aspect of the present invention is a soldering method comprising:

an application step of applying a flux having water as a solvent to a surface of an electronic circuit board to be soldered;

a first heating step of heating the electronic circuit board;

a water removal step of removing water attached to the electronic circuit board after processing in the first heating step;

a second heating step of heating the electronic circuit board to maintain the electronic circuit board at a temperature at which the flux exerts its activating action;

a solder attachment step of attaching molten solder to the electronic circuit board; and a cooling step of cooling the electronic circuit board, wherein the application step, the first heating step, the water removal step, the second heating step, the solder attachment step and the cooling step are successively performed along the direction of conveyance of the electronic circuit board, and wherein the water removal step includes a gas blowing step of blowing a gas to an electronic component disposition surface of the electronic circuit board on which electronic components are disposed, and a drawing step of drawing water from the surface to be soldered.

The 12$^{th}$ aspect of the present invention is the soldering method according to the 11$^{th}$ aspect of the present invention, wherein the water removal step includes a shaking step of shaking the electronic components disposed on the electronic circuit board, and the shaking step is performed by blowing the gas used in the gas blowing step to the electronic components.

The 13$^{th}$ aspect of the present invention is the soldering method according to the 11$^{th}$ aspect of the present invention, wherein the gas blowing step includes a step of changing at least one of the direction, intensity and position of blowing of the gas.

The present invention has the advantage of enabling a soldering apparatus and method to be used so that no part of the water content of a flux remains on an electronic circuit board before soldering.

BRIEF DESCRIPTION OF THE DRAWINGS

FIGS. 6(A) and 6(B) are diagrams showing the operation of the water removal device in the second embodiment of the present invention;

FIGS. 7(A), 7(B), and 7(C) are diagrams showing another example of the arrangement for the water removal device constituted by a first jig and a second jig in the second embodiment of the present invention;

FIGS. 9(A) and 9(B) are diagrams showing a water removal device constituted by a first jig and a second jig in a third embodiment of the present invention;

FIGS. 10(A) and 10(B) are diagrams showing another example of the arrangement for the water removal device constituted by a first jig and a second jig in the third embodiment of the present invention;

FIGS. 11(A) and 11(B) are diagrams showing still another example of the arrangement for the water removal device constituted by a first jig and a second jig in the third embodiment of the present invention;

DESCRIPTION OF SYMBOLS

Figure 1:
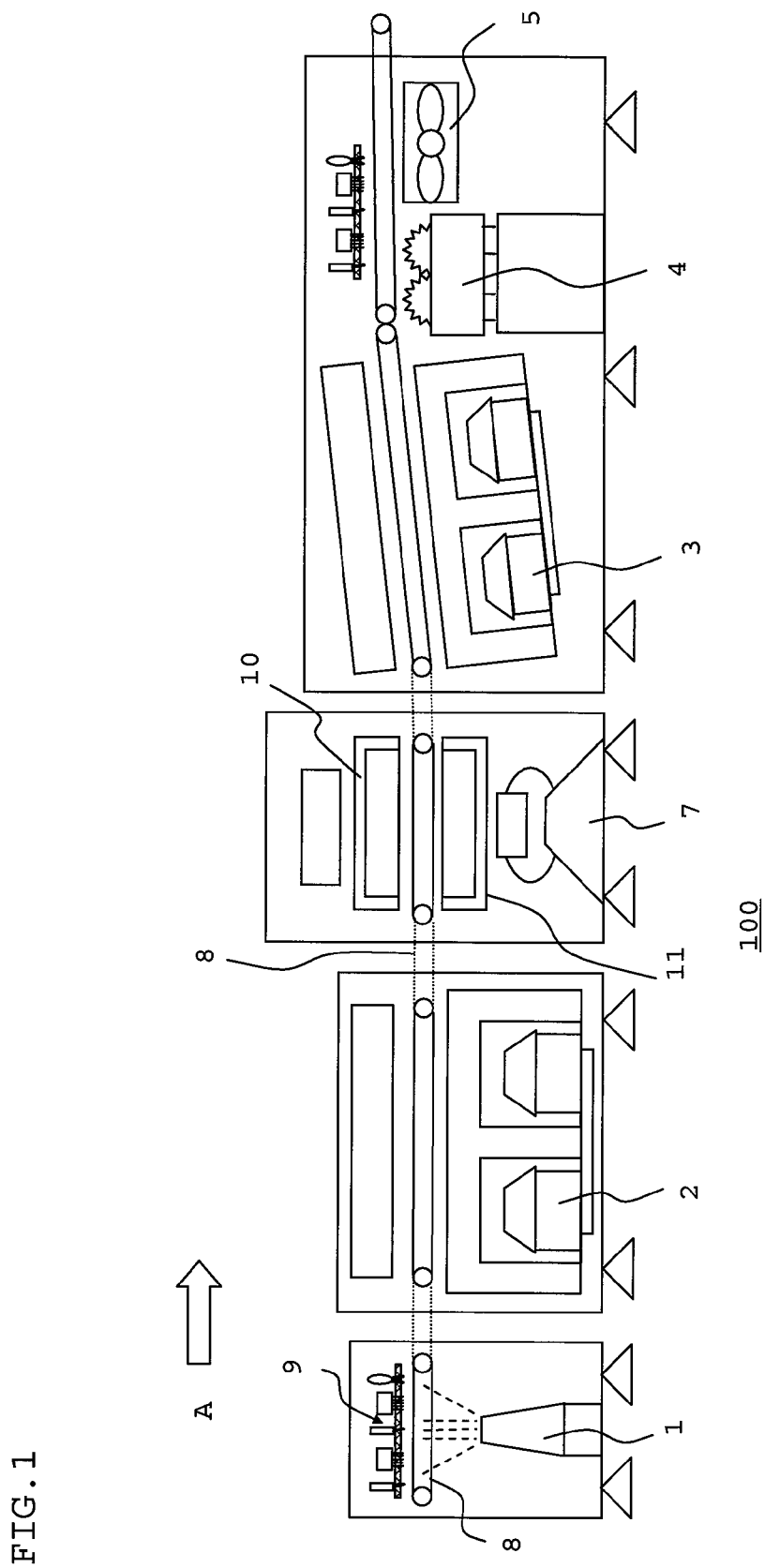
FIG. 1 is a diagram showing an arrangement for a soldering apparatus in a first embodiment of the present invention.

1 Fluxer
2 First heating device
3 Second heating device
4 Flow solder bath
5 Cooler
6 Vacuum drying device
7 Water removal device
7a, 7c Drive mechanism
7b, 7d Cylinder
8 Conveyor
9 Electronic circuit board
9a Electronic component body
9b Lead
10, 12, 15, 17 First jig
10a, 11b Recess
10b, 11b Opening
10c, 11c Communication passage
10d, 11d Hole
10e, 10e', 11e Partition wall
11, 18 Second jig
13a Spring
13b Protective portion
14 Sponge
19 Sponge
A Direction of forward movement of conveyor
100 Soldering apparatus

PREFERRED EMBODIMENTS OF THE INVENTION

Embodiments of the present invention will be described in detail with reference to the accompanying drawings.

First Embodiment

Figure 12:
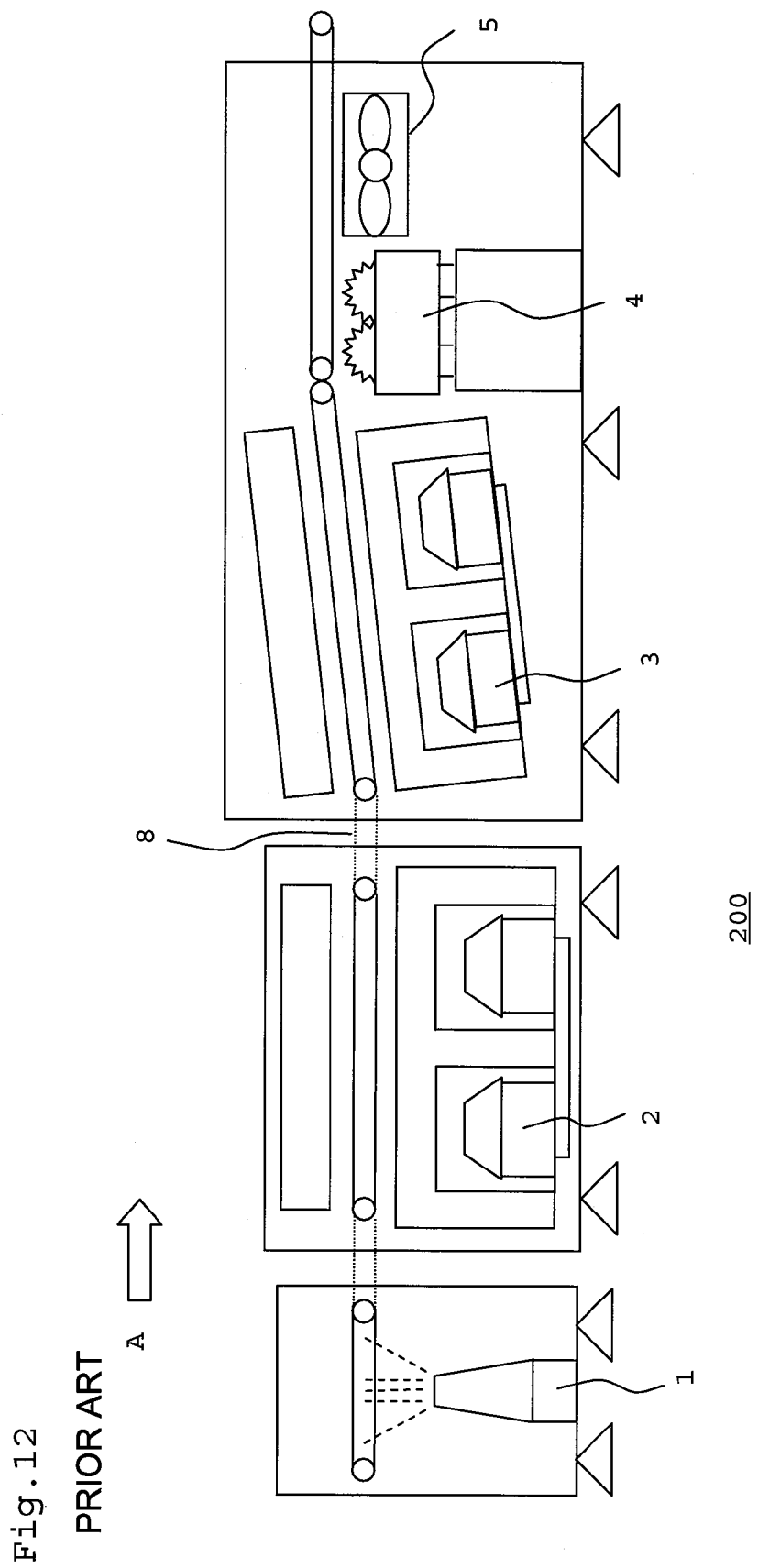
FIG. 12 is a diagram showing an arrangement for a conventional soldering apparatus.
Figure 13:
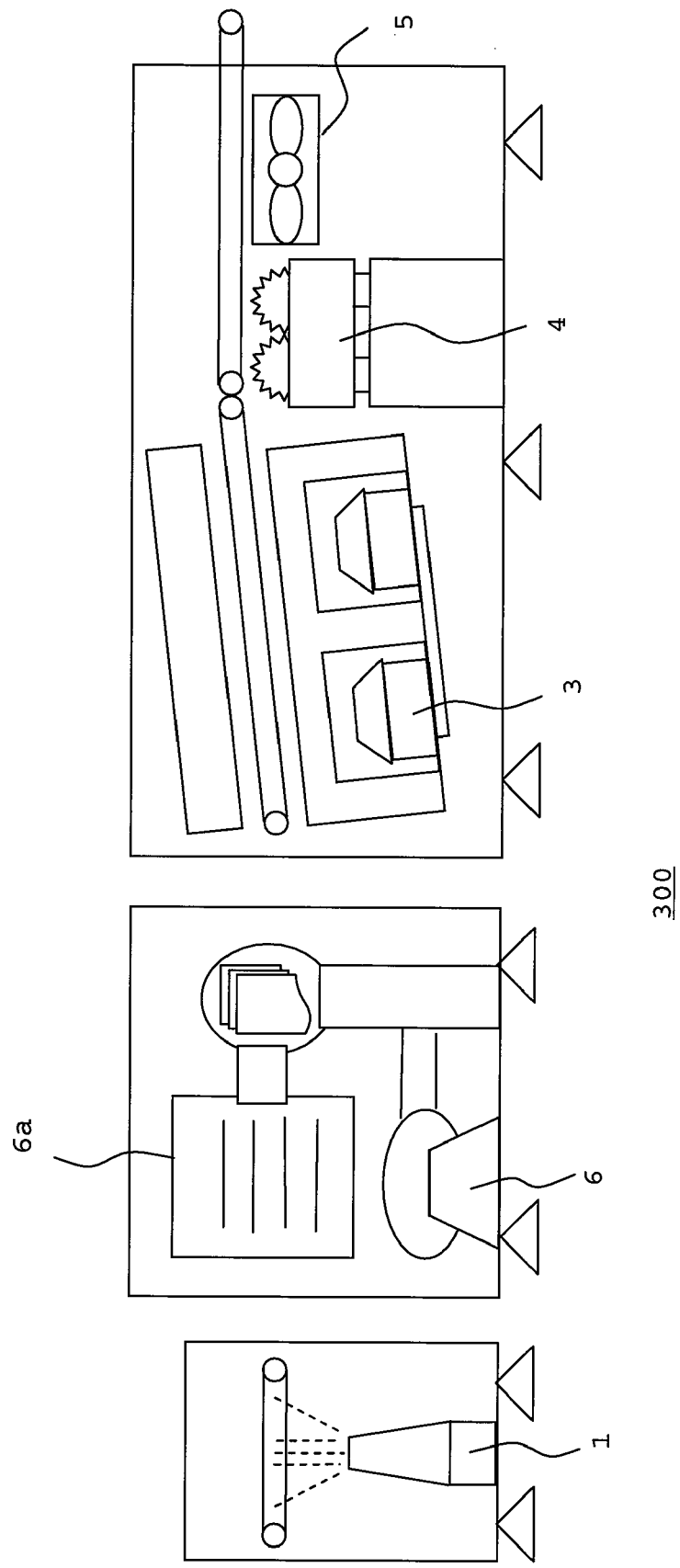
FIG. 13 is a diagram showing another arrangement for a conventional soldering apparatus.

FIG. 1 is a diagram showing an arrangement for a flow soldering apparatus in the first embodiment of the present invention. In FIG. 1, components corresponding to and equivalent in function to those described with reference to FIGS. 12 and 13 are indicated by the same reference numerals. In other figures referred to below, components are indicated in the same way.

As shown in FIG. 1, a soldering apparatus 100 in the first embodiment is constituted by a fluxer 1, a first heating device 2, a water removal device 7, a second heating device 3, a flow solder bath 4 and a cooler 5. The fluxer 1, the first heating device 2 and the water removal device 7 are respectively disposed independently of each other, while the second heating device 3, the flow solder bath 4 and the cooler 5 are integrally housed in one unit.

The fluxer 1 used in the first embodiment is of such a type as to spray a flux from a spray nozzle, and the first heating device 2 has a far infrared ray drying device and a hot air drying device, and is using far infrared rays and hot air in combination.

The water removal device 7 has a first jig 10 and a second jig 11 disposed so that an electronic circuit board 9 processed with the first heating device 2 is inserted between the first and second jigs 10 and 11, with the front and back surfaces of the electronic circuit board 9 respectively facing the first and second jigs 10 and 11.

FIG. 2(A) is a diagram showing the water removal device in the first embodiment constituted by the first jig adapted to holes formed in the electronic circuit board and to electronic component parts mounted on the electronic circuit board, and the second jig adapted to the holes in the electronic circuit board and to leads of the electronic component parts.

As shown in FIG. 2(A), the first jig 10 has a lid-like shape such as to surround edge portions of the electronic circuit board 9 and has internal partition walls 10e corresponding to the positions, shapes and sizes of the holes formed in the front surface of the electronic circuit board 9 and of the electronic component parts mounted on the electronic circuit board 9. The holes formed in the electronic circuit board 9 or the electronic component parts mounted on the electronic circuit board 9 are aligned with or fitted in spaces formed by the partition walls 10e or edges of the first jig 10. As an example of these spaces, a recess 10a corresponding to an electronic component body 9a mounted on the electronic circuit board 9 is shown. However, other corresponding portions shown in the figure are also provided in similar forms. A hole 10d is formed in a ceiling portion of the recess 10a to enable introduction of outside air from an opening 10b via a communication passage 10c, which is also connected to the other recesses.

On the other hand, the second jig 11 has a tray-like shape such as to surround edge portions of the electronic circuit board 9 and has internal partition walls 11e corresponding to the positions, shapes and sizes of the holes formed in the back surface of the electronic circuit board 9 and of leads of the electronic component parts exposed on the back surface side. The holes or the leads exposed in the back surface of the electronic circuit board 9 are aligned with or fitted in spaces formed by the partition walls 11e or edges of the second jig 11. As an example of these spaces, a recess 11a corresponding to a lead 9b extending from the electronic component body 9a mounted on the electronic circuit board 9 is shown. However, other corresponding portions shown in the figure are also provided in similar forms. A hole 11d is formed in a bottom portion of the recess 11a to enable suction of outside air and water from an opening 11b via a communication passage 11c.

The second heating device 3 used in the first embodiment has a infrared ray drying device and a hot air drying device and is using infrared rays and hot air in combination. The flow solder bath 4 is constituted by a primary flow nozzle and a secondary flow nozzle and contains molten solder. A propeller-type blower is mounted in the cooler 5. The cooler 5 blows cool air to the electronic circuit board 9 the temperature of which has been increased to a high temperature by contact with the flow solder bath 4, thereby cooling the electronic circuit board 9.

In the above-described arrangement, the soldering apparatus 100 corresponds to the soldering apparatus of the present invention; a conveyor 8, to the transport path of the present invention; the fluxer 1, to the fluxer of the present invention; the first heating device 2, to the first heating device of the present invention; the water removal device 7, to the water removal device of the present invention; the second heating device 3 to the second heating device of the present invention; the flow solder bath 4, to the flow solder bath of the present invention; and the cooler 5, to the cooler of the present invention. Also, the electronic circuit board 9 corresponds to the electronic circuit board of the present invention.

Also, the first jig 10 of the water removal device 7 corresponds to the first jig including the first frame of the air blowing portion of the present invention, and the second jig 11 corresponds to the second jig including the second frame of the present invention. Also, the partition walls 10e correspond to the first partition walls of the present invention, and the partition walls 11e correspond to the second partition walls of the present invention.

Description will be made below of the operation of the soldering apparatus in the first embodiment and of a flow soldering method which is an embodiment of the flow soldering method of the present invention while making reference to the accompanying drawings. As shown in FIG. 1, the fluxer 1, the first heating device 2, the water removal device 7, the second heating device 3, the flow solder bath 4 and the cooler 5 are successively disposed. The conveyor 8 of an in-line construction through the devices travels in the direction of arrow A shown in the figure from the fluxer 1 to the cooler 5 to covey the electronic circuit board 9.

The electronic circuit board 9 mounted on the conveyor 8 is conveyed in the direction of arrow A and a flux having water as a solvent is sprayed from a spray nozzle to the back surface of the electronic circuit board 9 (corresponding to the surface to be soldered according to the present invention) by the fluxer 1.

After passage through the fluxer 1, the electronic circuit board 9 is conveyed into the first heating device 2 and is heated by hot air at 100 to 290° C. to dry up water on the flux-applied surface of the electronic circuit board 9.

After passage through the first heating device 2, the electronic circuit board 9 is put in the water removal device 7 and is temporarily stopped on the conveyor 8 in the water removal device 7. Then, as shown in FIG. 2(B), the electronic circuit board 9 is inserted between the first jig 10 adapted to the holes formed in the electronic circuit board 9 and to the electronic component parts mounted on the first surface side of the electronic circuit board 9 and the second jig 11 adapted to the holes formed in the electronic circuit board 9 and to the leads of the electronic component parts mounted on the second surface side of the electronic circuit board 9, with the front surface of the electronic circuit board 9 (corresponding to the electronic component placement surface according to the present invention) and the back surface of the electronic circuit board 9 facing the first and second jigs 10 and 11, respectively. At this time, the electronic circuit board 9 is inserted together with the conveyor 8 conveying the electronic circuit board 9 between the first jig 10 and the second jig 11.

On the electronic circuit board 9 inserted between the first jig 10 and the second jig 11 facing the two surfaces of the electronic circuit board 9, a pressurized gas is blown to the individual electronic component part including the electronic component body 9a fitted in the recess 10a by means of a nozzle (not shown) of the water removal device 7 via the opening 10b, the communication passage 10c and the holes 10d in the first jig 10. Water scattered by this blowing is drawn by a depressurization unit (not shown) via the holes 11d, the communication passage 11c and the opening 11b in the second jig 11. Any kind of gas may be used as the pressurized gas. However, air usable at a low cost, nitrogen, which does not easily react with the flux, or the like, is preferable. The temperature of the gas may be room temperature or the gas may be hot air at about 50 to 100° C.

The gas pressurized at 0.1 to 2.0 MPa is blown from the first jig 10 to the electronic circuit board 9 inserted between the first jig 10 and the second jig 11. The flux and the water content of the flux scattered by blowing with the pressurized gas are drawn by the second jig 11 with a drawing force of −90 to −80 kPa to be collected. The treatment with the water removal device 7 thus operated was completed in 30 seconds. Curtain members may be provided at opposite ends of the first jig along the direction of arrow A in the figure, i.e., at the front and rear ends of the electronic circuit board 9, to stop the pressurized gas from leaking out from the first jig 10.

Figure 3:
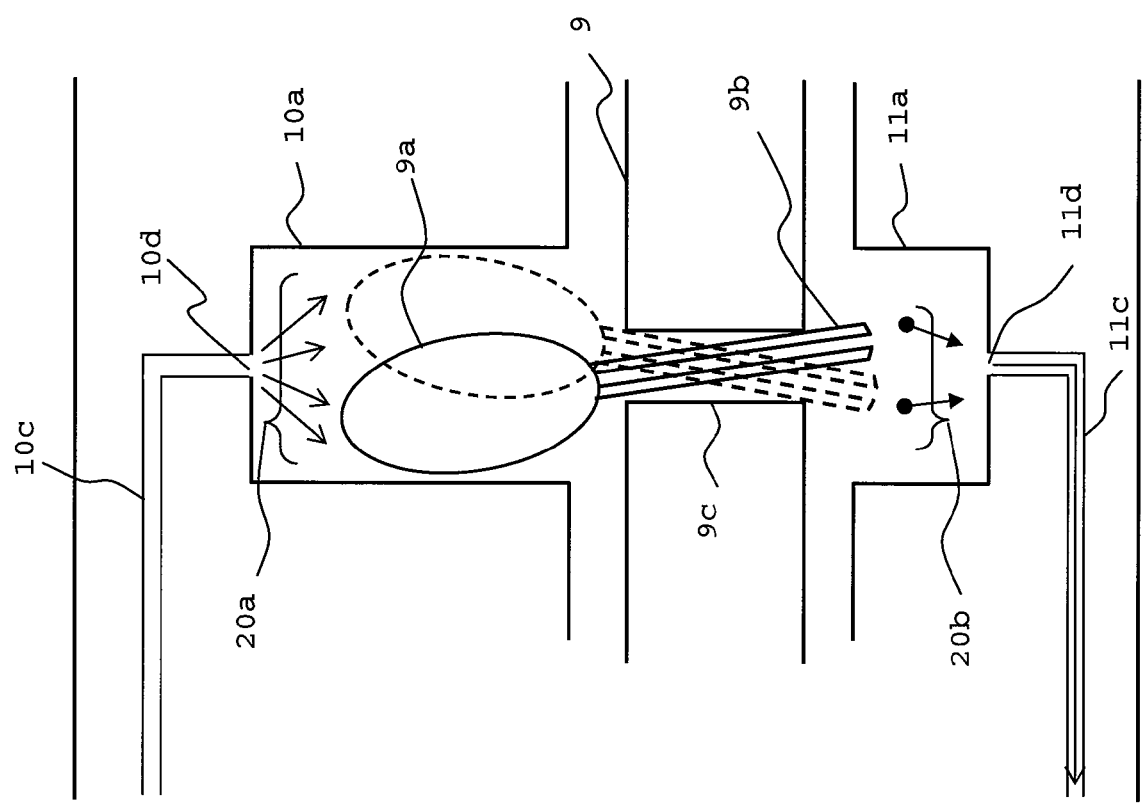
FIG. 3 is a diagram showing the operation of the water removal device in the first embodiment of the present invention.

The state of the electronic component part disposed in the space formed by the recesses 10a and 11a during the operation of the water removal device 7 will be described with reference to FIG. 3. Referring to FIG. 3, the electronic component body 9a is shaken in the space by the action of the pressurized gas 20a blown in through the hole 10d, as indicated by the solid and broken lines in FIG. 3. Similarly, the lead 9b is also shaken in the hole 9c which is formed in the electronic circuit board 9 and in which the electronic component part 9a is inserted. Even a film of water remaining in the gap between the electronic component body 9a or the lead 9b and a peripheral portion of the hole 9c in which the electronic component part is inserted is also blown away as a liquid droplet 20b from the hole 9c toward the recess 11a. The liquid droplet 20b is drawn to the outside through the hole 11d in the recess 11a and through the communication passage 11c.

After removal of water existing in the holes formed in the electronic circuit board 9 and the gaps around the electronic component parts mounted on the electronic circuit board 9 by the water removal device 7, the electronic circuit board 9 is heated with hot air at 100 to 150° C. in the second heating device 3. Since the water has been removed, the activating action of the flux can be sufficiently exerted and no inadequate wetting occurs. After being taken out of the second heating device 3, the electronic circuit board 9 is conveyed into the flow solder bath 4 and brought into contact with flowed molten solder. The molten solder is thereby attached to the electronic circuit board 9. At this time, no solder ball defect occurs because the water has been removed.

The electronic circuit board 9 to which molten solder is attached is conveyed to the cooler 5. Cool air is blown to the electronic circuit board 9 by the cooler 5 to solidify the solder attached in a molten state to the soldered portion and to cool the electronic circuit board 9 the temperature of which is increased by contact with the molten solder in the flow solder bath, thus completing soldering.

The soldering apparatus in the first embodiment of the present invention is provided with the water removal device 7 capable of reliably removing water remaining on the electronic circuit board 9 in a short time by using a pressurized gas and is, therefore, capable of executing each soldering step while conveying the electronic circuit board 9 on the conveyor 8.

Second Embodiment

The soldering apparatus according to the first embodiment of the present invention removes water existing in holes in the electronic circuit board 9 and gaps between the electronic circuit board 9 and electronic component parts mounted on the electronic circuit board 9 by blowing a pressurized gas from the first jig 10 so that electronic component parts mounted on the electronic circuit board 9 are shaken.

In some cases, however, electronic component parts are affected by shaking. For example, in the case of electronic component parts including fine precise movable portions, such as micro electromechanical systems (MEMSs), damage and malfunction under the influence of shaking are envisaged.

The soldering apparatus according to the second embodiment is arranged so as to be capable of handling electronic component parts of such a kind preferably prevented from being shaken.

Figure 2:
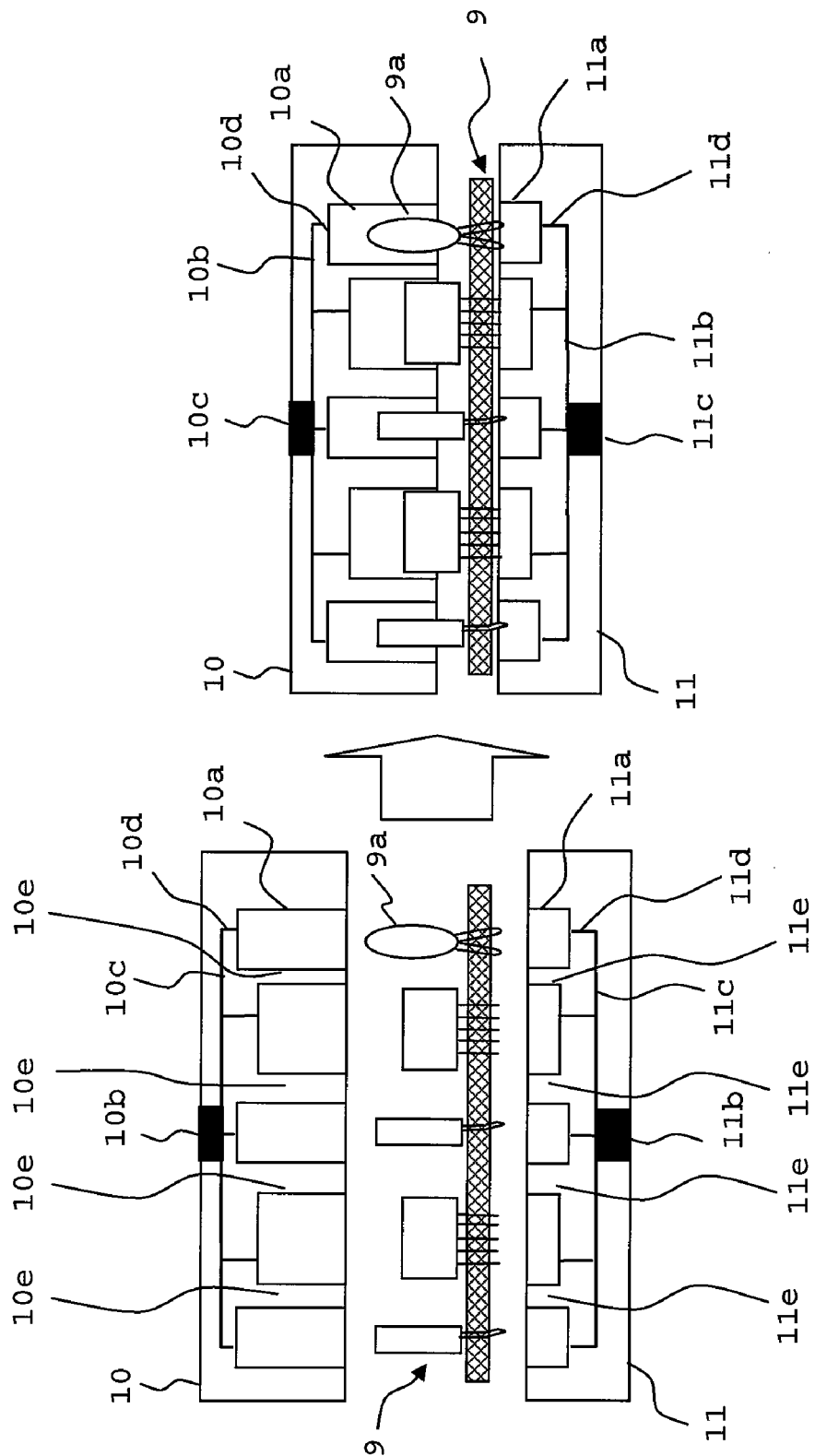
FIGS. 2(A) and 2(B) are diagrams showing a water removal device constituted by a first jig and a second jig in the first embodiment of the present invention.

FIGS. 4(A), 4(B), and 4(C) are diagrams showing an internal arrangement for the water removal device 7 in the soldering apparatus according to the second embodiment of the present invention. Portions identical or corresponding to those shown in FIG. 2 are indicated by the same reference characters, and the detailed description of them will not be repeated.

The water removal device 7 in the second embodiment has a first jig 12 in place of the first jig 10.

As shown in FIG. 4(A), the first jig 12 has, in the construction of the first jig 10 of the first embodiment, springs 13a made of metallic material and provided on the surfaces in which holes 10d through which a pressurized gas is jetted are formed, and protective portions 13b made of a soft material such as silicon rubber or natural rubber are provided on tips of the springs 13a.

The lengths of the protective portions 13b are adjusted to such values that the protective portions 13b respectively contact top portions of electronic component parts on the electronic circuit board 9 in a state where the electronic circuit board 9 is inserted between the first and second jigs 12 and 11 shown in FIG. 4(B), the first and second jigs 12 and 11 facing the two surfaces of the electronic circuit board 9.

FIG. 4(C) is an enlarged view of an essential portion of the electronic circuit board 9 inserted between the first and second jigs 12 and 11. As shown in FIG. 4(C), the protective portion 13b contacts a top portion of the electronic component body 9a and applies the elastic force of the spring 13a to the electronic component body 9a. The electronic component part is thereby held in a position such as to be stationary with respect to the first and second jigs 12 and 11. Since the protective portion 13b is made of a soft material, there is no possibility of the protective portion 13b damaging the surface of the electronic component body 9a.

Further, in the first jig 12, partition walls 10e' for forming recesses 10a' in which the electronic component parts are fitted are reduced in thickness in comparison with the partition walls 10e in the first jig 10, thereby increasing the recesses 10a' in breadth relative to the recesses 10a in the first embodiment 1 so that the electronic component parts are disposed at sufficiently increased distances from adjacent wall surfaces such as the partition walls 10e', as shown in FIGS. 4(B) and 4(C).

Figure 5:
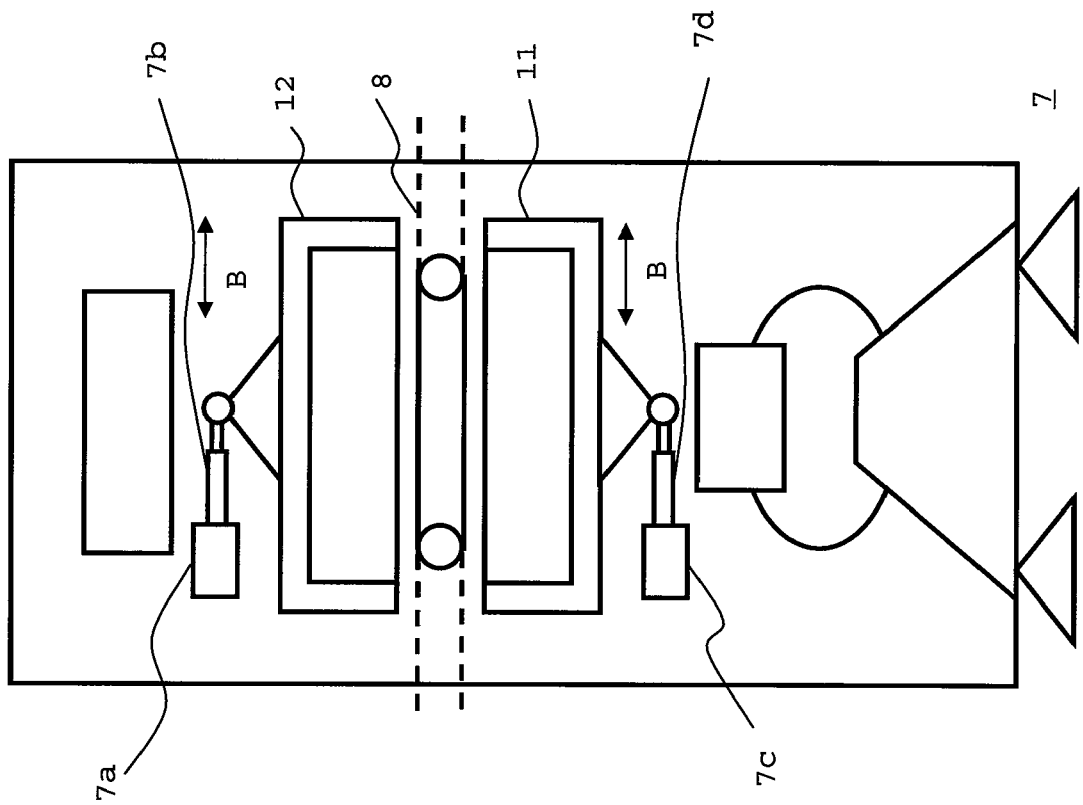
FIG. 5 is a diagram showing the water removal device constituted by a first jig and a second jig in the second embodiment of the present invention.

In the second embodiment, in addition to the above-described arrangement, the positions of a pair of the first jig 12 and the second jig 11 and the electronic circuit board 9 can be changed in the direction of conveyance of the electronic circuit board 9. That is, as shown in FIG. 5, cylinders 7b and 7d which are extended and contracted along the directions of arrows B in the figure by drive mechanism 7a and 7c which generates driving forces by hydraulic or pneumatic forces are provided outside the first and second jigs 12 and 11 in the water removal device 7. The first and second jigs 12 and 11 are translated along the conveyor 8 according to the expansion/contraction of the cylinders 7b and 7d.

In the above-described arrangement, the first jig 12 corresponds to the first jig of the present invention and the partition walls 10e' correspond to the first partition walls of the present invention. Also, the drive mechanisms 7a and 7c and the cylinders 7b and 7d correspond to the device position changing portion of the present invention.

The operation of the second embodiment having the above-described arrangement is as described below.

As shown in FIG. 6(A), the first and second jigs 12 and 11 are shifted in the direction of arrow C in the figure, i.e., the direction of backward movement of the conveyor 8. In this case, since the electronic component body 9a is fixed by the protective portion 13b of the first jig 12, the electronic component body 9a moves with the shift of the first jig 12. With this movement, the position of the lead 9b extending from the electronic component body 9a and inserted in the hole 9c of the electronic circuit board 9 becomes one-sided to form a space 9d on the side opposite from the shifting direction, i.e., on the right-hand side as viewed in the figure. A film of water existing in the hole in the electronic circuit board 9 or in the gap between the electronic circuit board 9 and the mounted electronic component part is broken by widening of the gap as the space 9d, so that part of the water falls dropwise into the recess 11a' of the second jig 11 or moves onto the surface of the electronic circuit board 9.

When blowing of a pressurized gas is performed in this state in the same way as in the first embodiment, the water in the space 9d is scattered from the electronic circuit board 9 by the pressurized gas blown in the vicinity of the space 9d to be drawn through the recess 11a' in the second jig 11.

Further, as shown in FIG. 6(B), the first and second jigs 12 and 11 are shifted in the direction of arrow D in the figure, i.e., the direction of forward movement of the conveyor 8. In this case, the position of the lead 9b extending from the electronic component body 9a and inserted in the hole 9c of the electronic circuit board 9 becomes one-sided to form a space 9e on the side opposite from the shifting direction, i.e., on the left-hand side as viewed in the figure. When blowing of the pressurized gas is performed in this state in the same way as in the first embodiment, the water in the space 9e is scattered from the electronic circuit board 9 by the pressurized gas blown in the vicinity of the space 9e to be collected on the second jig 11 side.

As described above, in the soldering apparatus of the second embodiment, the electronic component parts are fixed on the electronic circuit boards 9 by the first jig 12, and blowing of the pressurized gas is performed while changing the positions of a pair of the first and second jigs 12 and 11 and the electronic circuit board 9, thus enabling removal of water existing in the holes in the electronic circuit board 9 and the gaps between the electronic circuit board 9 and the electronic component parts mounted on the electronic circuit board 9 without shaking the electronic component parts.

Water which flows out from the gaps and moves around in different places can be effectively scattered by repeating the operations shown in FIGS. 6(A) and 6(B) in particular.

In the above-described second embodiment, there is a need to mount a combination of different types of springs 13a and protective portions 13 according to kinds of electronic circuit boards 9 because of layout according to the number of electronic component parts and, hence, a need to change the jigs in correspondence with stage replacements, and there is, therefore, a risk of reducing the productivity.

Therefore, a first jig 15 to which a sponge 14 is attached may be used in place of the springs 13a and the protective portions 13b for making electronic component parts stationary with respect to the first jig, as shown in FIGS. 7(A) to 7(C). As a material for the sponge 14, natural rubber, silicon rubber, polyurethane, polyolefin, polyethylene or the like may be used. In this way, the arrangement using a combination of the springs 13a and the protective portions 13b can be realized by using a single material. Each of these materials used for the sponge 14 may be used as a material for the protective portions 13b.

A water removal device 7 based on the arrangement shown in FIGS. 7(A) to 7(C) was made to construct the soldering device, and the movement of electronic component parts and the state of removal of water attached to the electronic circuit board 9 when blowing of a pressurized gas is performed were observed to find that water was completely removed.

While the description has been made of the arrangement in which both the first and second jigs 12 and 11 are moved with respect to the electronic circuit board 9 while the electronic component parts are made stationary with respect to the first jig 12, the arrangement may alternatively be such that only the first jig 12 is moved with respect to the electronic circuit board 9. In such a case, the drive mechanism 7c and the cylinder 7d may be removed. Also, the first and second jigs 12 and 11 may be moved by using electromagnetic-drive actuators in place of the drive mechanisms 7a and 7c and the cylinders 7b and 7d. Also, the electronic circuit board 9 may be moved by moving the conveyor 8 while removing the drive mechanisms and the cylinders.

Further, the arrangement may alternatively be such that the first and second jigs 12 and 11 are made stationary with respect to the electronic circuit board 9.

Figure 4:
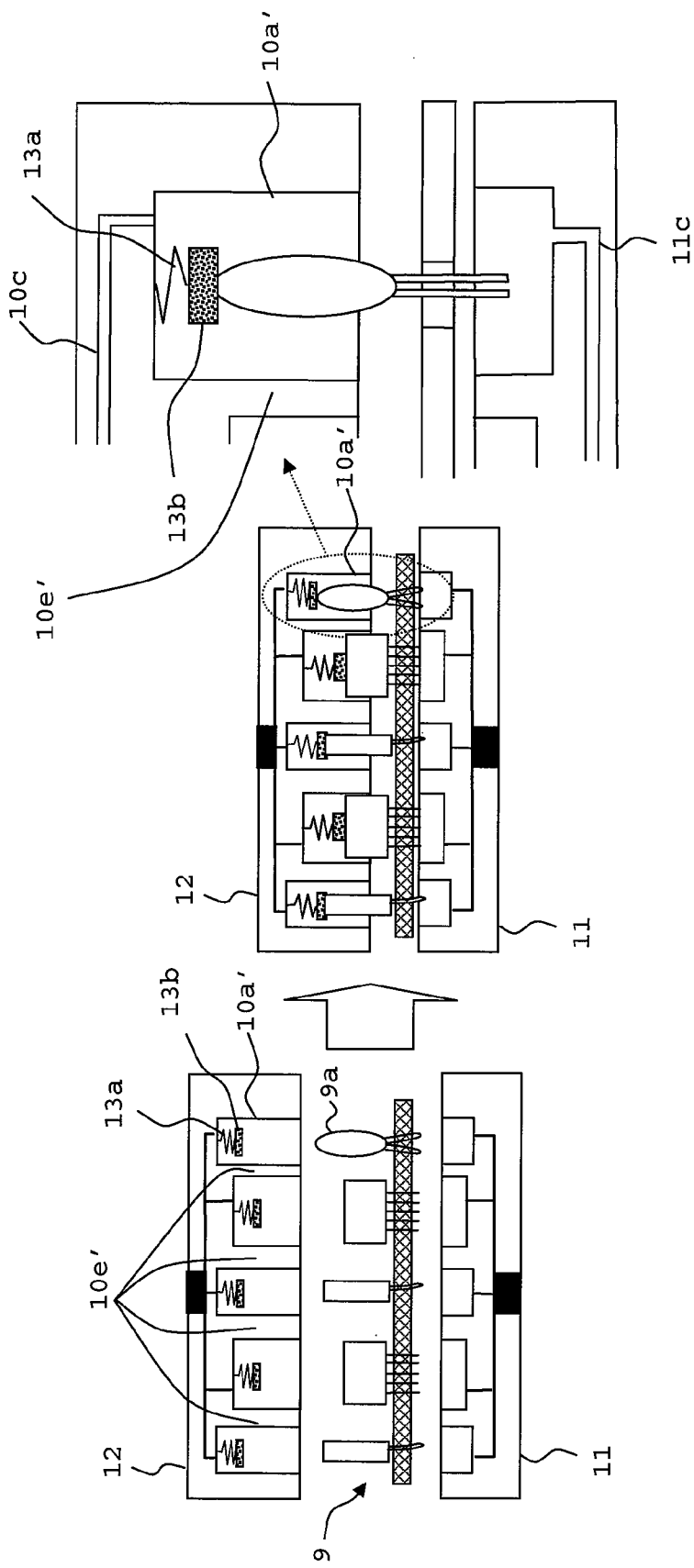
FIGS. 4(A), 4(B), and 4(C) are diagrams showing a water removal device constituted by a first jig and a second jig in a second embodiment of the present invention.
Figure 8A:
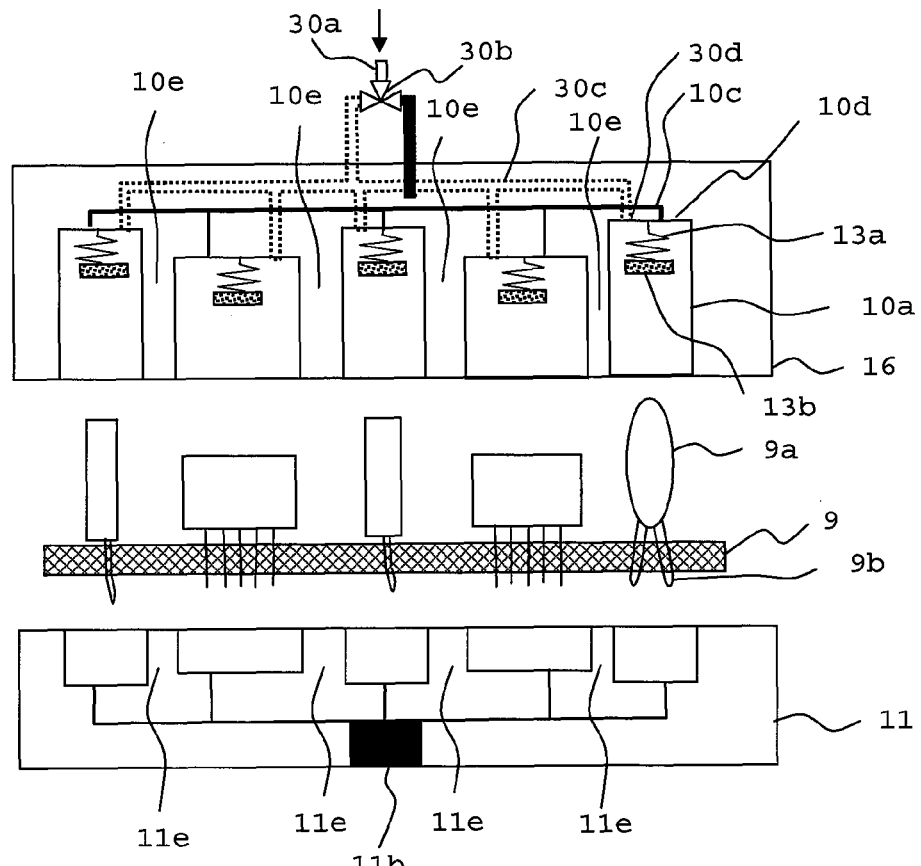
FIGS. 8(A) and 8(B) are diagrams showing another example of the arrangement for the water removal device constituted by a first jig and a second jig in the second embodiment of the present invention.
Figure 8B:
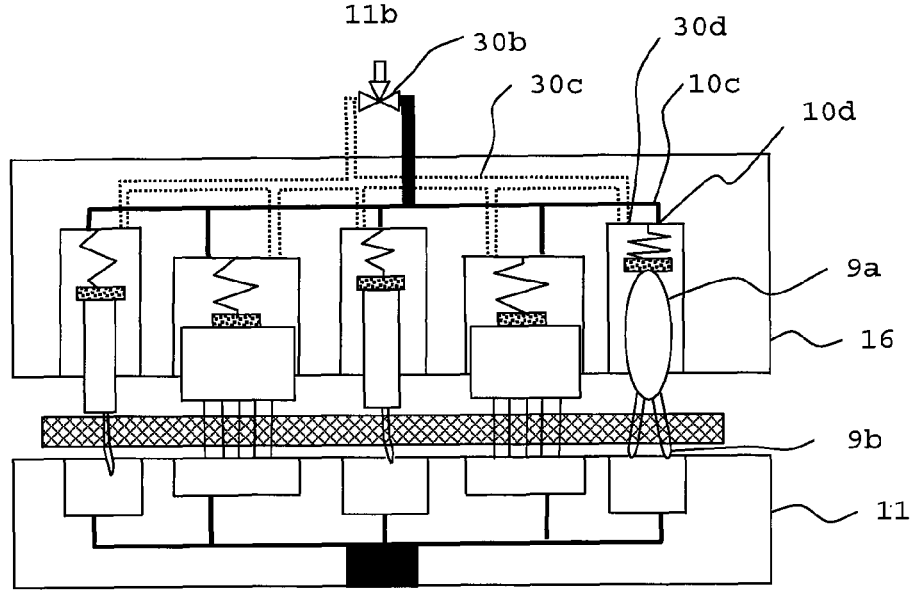

FIGS. 8(A) and 8(B) show an example of such an arrangement. Portions identical or corresponding to those shown in FIG. 2 or 4 are indicated by the same reference characters, and the detailed description of them will not be repeated.

A first jig 16 shown in FIG. 8(A) is obtained by doubling the pressurized gas blowing mechanism in the arrangement of the construction of the first jig 12 in the second embodiment. More specifically, holes 30d are provided in the recesses 10a at positions different from the positions of the holes 10d, and the holes 30d communicate with each other through a communication passage 30c independent of the communication passage 10c. The communication passage 30c and the communication passage 10c are connected to a three-way valve 30b, which is connected to a main passage 30a into which a pressurized gas is introduced from the outside. The three-way valve 30b is selectively switched so that the pressurized gas introduced from the main passage 30a is introduced into one of the communication passage 30c and the communication passage 10c.

With this arrangement, as shown in FIG. 8(B), the pressurized gas can be selectively blown in from the holes 10d and the 30d in a state where the electronic circuit board 9 is inserted between the first and second jigs 16 and 11 facing the two surfaces of the electronic circuit board 9, and where the top portions of the electronic component parts including the electronic component body 9a are fixed by the springs 13a and the protective portions 13b. In this case, water remaining at positions in dead spaces as seen from the flows of the pressurized gas blown in from the holes 10d or 30d can be scattered by the pressurized gas blown in from the other holes 30d or 10d, thus achieving the same effect as that of the arrangement shown in FIG. 4.

The pressurized gas through the main passage 30a may be introduced at different pressures from the communication passages 30c and 10c. Also, the pressurized gas may be blown in at different blowing angles from the holes 10d and 30d.

Third Embodiment

In the above-described first and second embodiments, the first jigs 10, 12, 15, and 16 and the second jig 11 respectively have recesses 10a, 10a', and 11a formed in correspondence with the holes formed in the electronic circuit board 9 and the electronic component parts mounted on the electronic circuit board 9. In this case, there is a need to make the jigs according to the model of a device using the electronic circuit board 9, the design and mounted state of the electronic circuit board 9 and the positions, shapes and sizes of the holes formed in the electronic circuit board 9 and the electronic component parts mounted on the electronic circuit board 9. Therefore, a situation is conceivable in which an extremely high jig making cost and an extremely long model change time are required.

The third embodiment of the present invention is characterized by improving the general versatility independently of the model, etc., of the device in which the electronic circuit board 9 is used while considering the above-described circumstances.

FIGS. 9(A) and 9(B) are diagrams showing an internal arrangement for the water removal device 7 in the soldering apparatus according to the third embodiment of the present invention. Portions identical or corresponding to those shown in FIG. 2 or 4 are indicated by the same reference characters, and the detailed description for them will not be repeated.

The water removal device 7 in the third embodiment has a first jig 17 and a second jig 18 in place of the first jig 10 and the second jig 11.

The first jig 17 has a lid-like shape such as to cover edge portions of the electronic circuit board 9 and has no partition walls. Also, the second jig 18 has a tray-like shape such as to cover edge portions of the electronic circuit board 9 and has no partition walls.

A sponge 19 is provided on the entire surface of the first jig 17 facing the electronic circuit board 9. The same material as that of the sponge 14 in the second embodiment may be used for the sponge 19. However, the sponge 19 is porous, has one major surface in contact with the opening 10b and permits a pressurized gas from the opening 10b to uniformly pass therethrough and to be released through the other major surface.

In the above-described arrangement, the first jig 17 corresponds to the first jig including the first frame of the present invention, and the second jig 18 corresponds to the second jig including the second frame of the present invention.

The operation of the third embodiment will be described below. As shown in FIG. 1, the electronic circuit board 9 to which a flux having water as a solvent was applied by the fluxer 1 was conveyed into the first heating device 2 by the conveyor 8, heated in an atmosphere at 100 to 290° C., and thereafter conveyed to the water removal device 7. In the water removal device 7, conveyance of the electronic circuit board 9 on the conveyor 8 was temporarily stopped, the second jig 18 was applied, and the flux-applied surface of the electronic circuit board 9 was thereafter attracted to the second jig 18 by a drawing force of −90 to −80 kPa to uniformly maintain the orientation of leads of electronic component parts. Subsequently, the first jig 17 for blowing the pressurized gas to the electronic circuit board 9 was applied and the pressurized gas was blown at 0.1 to 2.0 MPa for 30 seconds while regulating the air flow path at the time of blowing of the pressurized gas by fixing the electronic component parts with the sponge 19.

At this time, since the sponge 19 was adjusted to such a length as to contact top portions of the electronic component parts in a state where the electronic circuit board 9 was inserted between the first and second jigs 17 and 18 facing the two surfaces of the electronic circuit board 9 as shown in FIG. 9(B), the positions of the electronic component parts were fixed by the pressing action of the sponge 19 and no movements of the parts were observed at the time of blowing of the pressurized gas. The pressurized gas was continuously blown by a force of 0.1 to 2.0 MPa. Further, in the state where the electronic circuit board 9 was inserted between the first and second jigs 17 and 18 facing the two surfaces of the electronic circuit board 9, the position of the electronic circuit board 9 was shifted, as in the case shown in FIGS. 6(A) and 6(B).

In this way, water attached on the holes in the electronic circuit board 9 and water which permeated through the gaps between the hole surfaces and the leads were completely removed by capillarity. This effect is the same as that of the second embodiment.

The electronic circuit board 9 from which attached water was removed was heated with hot air at 100 to 150° C. in the second heating device 3 to activate the flux. Oxide film on the soldered surface of the electronic circuit board 9 was clearly removed thereby. After the steps using the flow solder bath 4 and the cooler 5, the good soldered surface was obtained in a good solderable condition free from inadequate wetting, a solder ball defect and the like.

While it has been described that the sponge 19 is a porous material and that the pressurized gas from the opening 10b is directly released through the entire surface, the arrangement may alternatively be such that, as shown in FIGS. 10(A) and 10(B), a communication passage 19a communicating with the opening 10b is formed in the sponge 19 so as to have branches reaching the surface of the sponge 19. The pressurized gas can be communicated therethrough to the electronic circuit board 9 without weakening the flow.

Also, a plurality of openings 10b may be formed along the surface of the sponge, as shown in FIGS. 11(A) and 11(B). The pressurized gas can be uniformly communicated onto the surface of the electronic circuit board 9.

According to each embodiment of the present invention, as described above, film of water existing in vent holes in the electronic circuit board 9 and in the gaps between leads of electronic component parts and peripheral portions of the holes in which the electronic component parts are inserted can be removed by blowing a pressurized gas to the electronic circuit board 9 from above and by drawing the gas on the back surface side from below. That is, a flux having water as a solvent is applied to the surface of the electronic circuit board to be soldered; the water content of the flux applied to the surface of the electronic circuit board 9 to be soldered is thereafter removed by the first heating device 2; and water in the vent holes in the electronic circuit board 9 and in the gaps between the leads of the electronic component parts and peripheral portions of the holes in which the electronic component parts are inserted can be completely removed in a short time by the water removal device 7 in the in-line arrangement before the electronic circuit board 9 is put in the second heating device 3, thereby enabling the flux to be sufficiently activated by heating thereafter performed in the second heating device 3. As a result, a good soldered surface can be obtained without any defect when flow soldering is performed.

As described above, the present invention has the advantage of being used so that no water from a flux remains on an electronic circuit board before soldering, provides, for example, a soldering apparatus and method enabling complete removal of the water content of a flux having water as a solvent and applied to an electronic circuit board, and is applicable to soldering on an electronic circuit board in an apparatus which performs flow soldering using a flux.

What is claimed is:

1. A soldering apparatus comprising:
a conveyance path through which an electronic circuit board is conveyed;
a fluxer which applies a flux having water as a solvent to a surface of the electronic circuit board to be soldered;
a first heating device which heats the electronic circuit board;
a water removal device which removes water attached to the electronic circuit board after processing in the first heating device;
a second heating device which heats the electronic circuit board to maintain the electronic circuit board at a temperature at which the flux exerts its activating action;
a flow solder bath which attaches molten solder to the electronic circuit board; and
a cooler which cools the electronic circuit board,
wherein the fluxer, the first heating device, the water removal device, the second heating device, the flow solder bath and the cooler are successively disposed along the conveyance path,
wherein the water removal device has a gas blowing portion from which a gas is blown to an electronic component disposition surface of the electronic circuit board on which electronic component parts are disposed, and a drawing portion through which water is drawn from the surface to be soldered,
wherein the gas blowing portion has a first jig in the form of a lid, which is to surround one or more of the electronic component parts disposed on the electronic component disposition surface, and
wherein the drawing portion has a second jig in the form of a tray, which is to surround portions of the one or more electronic component parts surrounded by the first jig, the portions being on the surface to be soldered.

2. The soldering apparatus according to claim 1, wherein the gas blowing portion changes at least one of the direction, intensity and position of blowing of the gas.

3. The soldering apparatus according to claim 1, wherein the water removal device further has a relative position changing portion which changes the relative positional relationship between the electronic circuit board and the gas blowing portion.

4. The soldering apparatus according to claim 1, wherein the first jig includes a first frame formed so as to surround at least an edge portion of the electronic circuit board,
wherein the second jig includes a second frame formed so as to surround at least an edge portion of the electronic circuit board, and
wherein the water removal device operates the gas blowing portion and the drawing portion while inserting the electronic circuit board between the first jig and the second jig.

5. The soldering apparatus according to claim 4, wherein the first jig has an elastic member provided on a surface facing the electronic component disposition surface, and the elastic member contacts upper ends of the electronic component parts while the water removal device inserts the electronic circuit board between the first jig and the second jig.

6. The soldering apparatus according to claim 4, wherein the first jig has first partition walls provided on the surface facing the electronic component disposition surface, and the gas introduced to the gas blowing portion passes through portions sectioned by the first partition walls.

7. The soldering apparatus according to claim 5, wherein the first partition walls have shapes corresponding to the positions, shapes and sizes of the electronic components disposed on the electronic circuit board or holes provided in the electronic circuit board.

8. The soldering apparatus according to claim 7, wherein the first jig has an elastic member provided on each of surfaces of the portions sectioned by the first partition walls, the surface of the sectioned portions facing the electronic component disposition surface, and the elastic member contacts upper ends of the electronic component parts while the water removal device inserts the electronic circuit board between the first jig and the second jig.

9. The soldering apparatus according to claim 4, wherein the second jig has second partition walls provided on a surface facing the surface to be soldered, and water introduced to the drawing portion passes through portions sectioned by the second partition walls.

10. The soldering apparatus according to claim 9, wherein the second partition walls have shapes corresponding to the positions, shapes and sizes of leads of the electronic components disposed on the electronic circuit board or the holes provided in the electronic circuit board.

* * * * *